United States Patent
Hadji-Abdolhamid et al.

(10) Patent No.: US 8,836,374 B2
(45) Date of Patent: Sep. 16, 2014

(54) HIGH PERFORMANCE PRE-MIXER BUFFER IN WIRELESS COMMUNICATIONS SYSTEMS

(75) Inventors: Amir Hadji-Abdolhamid, Aliso Viejo, CA (US); Ahmad Mirzaei, San Diego, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 12 days.

(21) Appl. No.: 13/168,143

(22) Filed: Jun. 24, 2011

(65) Prior Publication Data
US 2012/0326754 A1    Dec. 27, 2012

(51) Int. Cl.
| | |
|---|---|
| G01R 19/00 | (2006.01) |
| H03F 3/45 | (2006.01) |
| H03K 19/00 | (2006.01) |
| H03F 3/24 | (2006.01) |
| H03F 3/189 | (2006.01) |
| H03F 1/02 | (2006.01) |

(52) U.S. Cl.
CPC ............ *H03K 19/00* (2013.01); *H03F 2200/27* (2013.01); *H03F 3/45179* (2013.01); *H03F 3/245* (2013.01); *H03F 2200/537* (2013.01); *H03F 2203/45394* (2013.01); *H03F 2200/555* (2013.01); *H03F 3/189* (2013.01); *H03F 2200/534* (2013.01); *H03F 2200/541* (2013.01); *H03F 1/0261* (2013.01)
USPC ............................... 327/54; 327/67; 330/260

(58) Field of Classification Search
USPC ............ 327/51, 52, 54, 56, 65, 67, 108, 171, 327/563, 590; 330/252, 259, 260, 261, 265, 330/267, 270, 271, 273, 277, 28, 291, 296, 330/302
See application file for complete search history.

(56) References Cited

U.S. PATENT DOCUMENTS

| | | | | |
|---|---|---|---|---|
| 5,386,207 | A  * | 1/1995 | Lin ............................ | 340/146.2 |
| 5,451,901 | A  * | 9/1995 | Welland ........................ | 330/133 |
| 5,912,582 | A  * | 6/1999 | Pisati et al. ................... | 327/551 |
| 5,939,904 | A  * | 8/1999 | Fetterman et al. .............. | 327/67 |
| 5,955,899 | A  * | 9/1999 | Afghahi .......................... | 327/65 |
| 6,509,795 | B1 * | 1/2003 | Ivanov .......................... | 330/253 |
| 6,617,888 | B2 * | 9/2003 | Volk .............................. | 327/67 |
| 6,727,757 | B1 * | 4/2004 | Venkatraman et al. ........ | 330/259 |
| 6,914,455 | B2 * | 7/2005 | Yoshida et al. ................. | 327/65 |
| 7,626,426 | B1 * | 12/2009 | Cho et al. ........................ | 327/65 |
| 2010/0109781 | A1* | 5/2010 | Deguchi et al. ............... | 330/296 |

* cited by examiner

*Primary Examiner* — Lincoln Donovan
*Assistant Examiner* — Jung H Kim
(74) *Attorney, Agent, or Firm* — Oblon, Spivak, McClelland, Maier & Neustadt, L.L.P.

(57) ABSTRACT

According to one embodiment, a high performance buffer for use in a communications system includes first and second differential blocks. Each of the first and second differential blocks comprise one or more driving transistors for generating a driving current for a load of the high performance buffer, and a feedback path for adjusting the operation of the one or more driving transistors. The feedback path includes a feedback transistor for receiving a common mode bias voltage, wherein the common mode bias voltage depends at least in part on a threshold voltage of the feedback transistor. The feedback path includes a programmable resistor and capacitor to reduce out of band loop gain and the noise. The high performance buffer is configured to achieve a high linearity, low output impedance, and low noise, and is suitable for use as a pre-mixer buffer in a wireless communications system.

18 Claims, 4 Drawing Sheets

HIGH PERFORMANCE PRE-MIXER BUFFER IN WIRELESS COMMUNICATIONS SYSTEMS

BACKGROUND OF THE INVENTION

1. Field of the Invention

The present invention is generally in the field of electrical circuits and systems. More specifically, the present invention is in the field of wireless communications circuits and systems.

2. Background Art

Transceivers are typically used in communications systems to support transmission and reception of communications signals through a common antenna, for example at radio frequency (RF) in a cellular telephone or other wireless communication device. A transmitter routinely implemented in such a transceiver may utilize several processing stages to condition and preamplify a transmit signal prior to passing the transmit signal to a power amplifier (PA). For example, the transmit signal may originate as a digital signal generated by a digital block of the transmitter. That digital signal is then typically converted into an analog baseband signal, by means of a digital-to-analog converter (DAC), for instance. The analog baseband signal may then be filtered using a low-pass filter (LPF) and up-converted to RF by a mixer. Subsequently, the up-converted signal can be processed by a PA driver, which then passes the preamplified transmit signal to the PA for additional amplification prior to transmission from the transceiver antenna.

As advances in electronics fabrication technologies enable the manufacture of ever smaller wireless transmitters, the need to implement area and power conserving circuit architectures becomes increasingly acute. As a result, passive mixer designs are becoming more desirable for use in up-converting baseband signals to RF due to their significantly reduced power and area requirements when compared with conventional active mixer designs, such as Gilbert cells, for example. In addition, passive mixer designs can provide excellent image rejection and very low local oscillator feedthrough across most gain ranges. Moreover, the devices used to implement passive mixers can be selected so as to scale with advances in semiconductor fabrication technology, thereby advantageously providing a persistent design solution.

Despite their potential advantages, the widespread use of passive mixers in wireless communications systems has been hindered by significant implementational challenges. For example, when compared to active mixers such as Gilbert cells, passive mixer designs typically require a considerably larger driving current, as well as requiring that the stage prior to the passive mixer provide a low output impedance. Moreover, the driving current and low prior stage output impedance requirements must be met without significantly impacting system performance, or substantially compromising the reductions in area and power resulting from passive mixer use.

Thus, there is a need to overcome the drawbacks and deficiencies in the art by providing a high performance buffer configured to provide high linearity, low output impedance, and low noise, and suitable for use as a pre-mixer buffer for a passive mixer implemented in a wireless communications system.

SUMMARY OF THE INVENTION

The present invention is directed to a high performance pre-mixer buffer in wireless communications systems, substantially as shown in and/or described in connection with at least one of the figures, and as set forth more completely in the claims.

DETAILED DESCRIPTION OF THE INVENTION

The present invention is directed to a high performance pre-mixer buffer in wireless communications systems. Although the invention is described with respect to specific embodiments, the principles of the invention, as defined by the claims appended herein, can obviously be applied beyond the specifically described embodiments of the invention described herein. Moreover, in the description of the present invention, certain details have been omitted in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
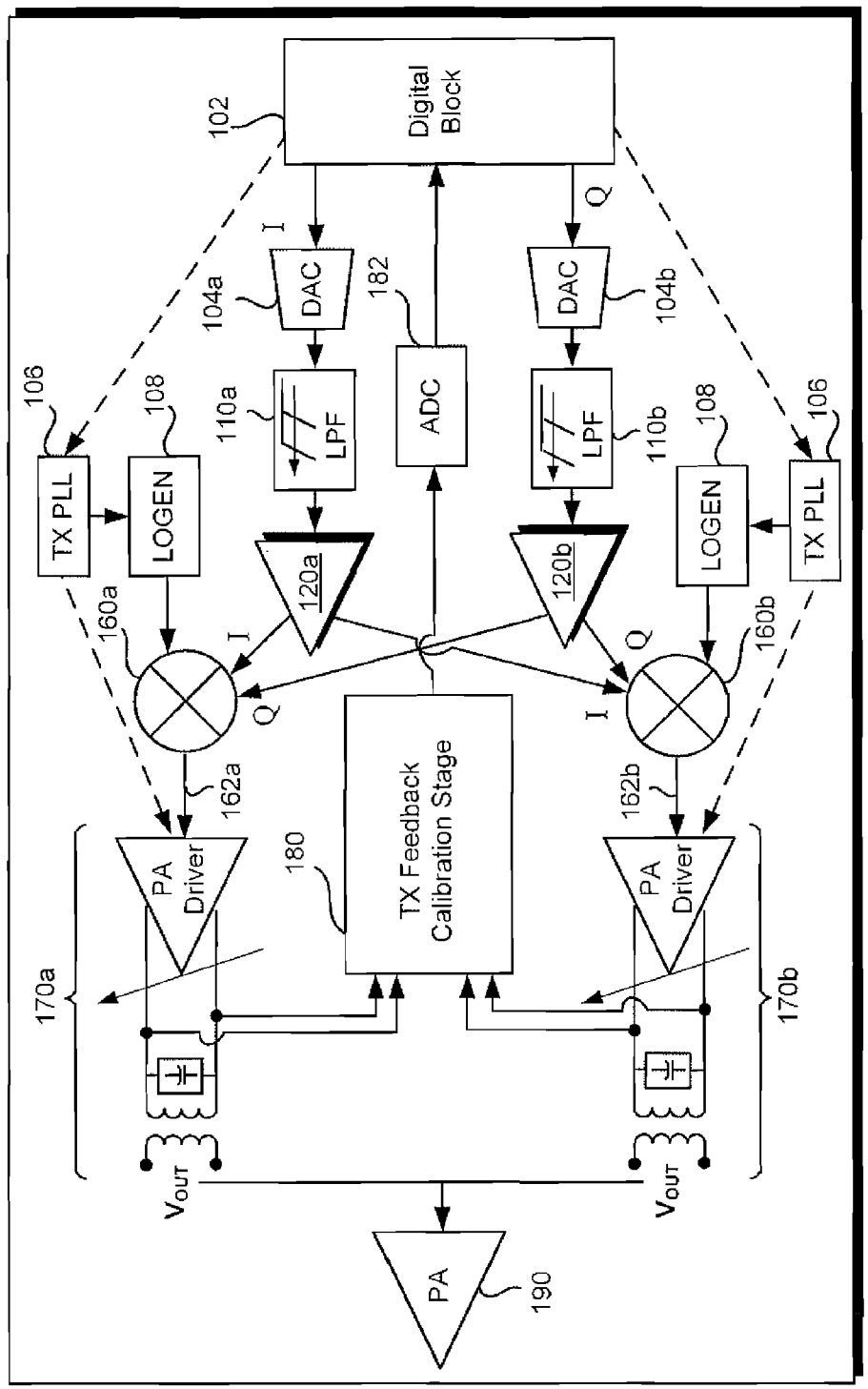
FIG. 1 is a diagram of a wireless transmitter including a high performance buffer implemented as a pre-mixer buffer, according to one embodiment of the present invention.

FIG. 1 is a diagram of a wireless transmitter including a high performance buffer implemented as a pre-mixer buffer, according to one embodiment of the present invention. As may be seen from FIG. 1, transmitter 100 may be configured to support multiple transmission modes and/or multiple transmission frequencies. For example, transmitter 100 can be configured as a radio frequency (RF) transmitter to support high-band transmission frequencies in a range between approximately 1.8 GHz and 2.2 GHz, as well as low-band transmission frequencies ranging between approximately 0.7 GHz and 1.1 GHz. It is noted that the implementational arrangement shown in FIG. 1, as well as the circuits represented by FIGS. 2, 3, and 4 of the present application, are for the purpose of assisting in the understanding of and conveying various concepts of the present invention. Elements shown in those figures are representations of physical and electrical elements used in implementing various embodiments of the present invention.

As shown in FIG. 1, transmitter 100 includes power amplifier (PA) 190, which can be coupled to an antenna utilized by transmitter 100 (antenna not shown in FIG. 1). As further shown in FIG. 1, transmitter 100 includes digital block 102 providing in-phase (I) and quadrature phase (Q) output signals, such as baseband signals, for example, to respective digital-to-analog converters (DACs) 104a and 104b. In addition, and as also shown in FIG. 1, transmitter 100 includes adjustable low-pass filters (adjustable LPFs) 110a and 110b.

To support high-band frequency channels as well as low-band frequency channels, transmitter 100 includes high-band mixer 160a and low-band mixer 160b, which are implemented in the present embodiment as passive circuits. As shown by FIG. 1, according to the present embodiment, the filtered baseband outputs of adjustable LPFs 110a and 110b are fed into respective high performance buffers 120a and 120b operating as pre mixer buffers for driving respective high-band passive mixer 160a and low-band passive mixer 160b. In order to drive high-band and low-band passive mixers 160a and 160b while concurrently enabling transmitter 100 to assume a compact low-power architecture, the present inventors realize that high performance buffers 120a and 120b must be designed and implemented so as to achieve a high linearity with high swing, low output impedance, low noise, and very low out-of-band noise. Moreover, because the baseband translated impedance from RF presented by each of high-band and low-band passive mixers 160a and 160b may present a differential load of approximately five hundred ohms (500Ω), for example, high performance buffers 120a and 120b must be configured to provide considerable driving current, such as plus-or-minus one milliampere (+/−1.0 mA) peak driving current, for example.

Transmitter 100 is also shown to include high-band variable gain control preamplification chain 170a and low band variable gain control preamplification chain 170b receiving respective up-converted mixer outputs 162a and 162b. Also shown in FIG. 1 are transmitter phase-locked loop (TX PLL) 106 and local oscillator generator (LOGEN) 108, as well as feedback calibration stage 180 providing calibration feedback data to digital block 102 through analog-to-digital converter (ADC) 182. It is noted that although TX PLL 106 and LOGEN 108 are shown in duplicate in FIG. 1 for the purpose of illustrative clarity, in practice, a single combination of TX PLL 106 and LOGEN 108 can be coupled to both respective high-band and low-band variable gain control preamplification chains 170a and 170b, and can be shared by respective high-band and low-band passive mixers 160a and 160b as well. It is further noted that although the embodiment of FIG. 1 characterizes baseband signal generation as being performed digitally by digital block 102, that need not be the case in all embodiments. Thus, digital block 102 may be seen to correspond more generally to any suitable baseband signal generator.

As mentioned above, the embodiment of FIG. 1 may be implemented to support multiple transmission modes, such as second-generation wireless telephone technology (2G) modes, 3G modes, and Long Term Evolution (LTE) modes, for example. In addition, Transmitter 100 is configured to support transmission modes employing quadrature modulation schemes as well as polar modulation. For example, in FIG. 1, transmission modes employing quadrature modulation can be associated with the solid line signal paths linking I and Q outputs of digital block 102 to variable gain control preamplification chains 170a and 170b through respective DAC/adjustable LPF/high performance buffer/passive mixer combinations 104ab/110ab/120ab/160a and 104ab/110ab/120ab/160b. Analogously, transmission modes employing polar modulation can be associated with the dashed line signal paths linking digital block 102 to variable gain control preamplification chains 170a and 170b through TX PLL 106.

It is noted that although most of the signal paths shown in FIG. 1 are represented by single lines for simplicity, many of those signals can comprise paired differential signals. Thus, the I and Q outputs of digital block 102 passed to respective high-band and low-band passive mixers 160a and 160b, the outputs 162a and 162b of respective high-band and low-band passive mixers 160a and 160b, the polar mode outputs of digital block 102 passed to high-band and low-band variable gain control preamplification chains 170a and 170b through TX PLL 106, and the feedback calibration signal returned to digital block 102 from feedback calibration stage 180 through ADC 182, for example, can comprise differential signals. It is further noted that the signal paths internal to high-band and low-band variable gain control preamplification chains 170a and 170b, as well as the feedback signals provided by those variable gain control preamplification chains to feedback calibration stage 180 are explicitly shown as differential signals.

As further shown in FIG. 1, the I and Q signal paths provided by respective DACs 104a and 104b, adjustable LPFs 110a and 110b, and high performance buffers 120a and 120b can be shared between the high-band and low-band transmission signals. In addition, a single implementation of each of digital block 102, TX PLL 106, LOGEN 108, feedback calibration stage 180, ADC 182, and PA 190 may be used to support all transmission modes and all transmission frequency bands. Consequently, transmitter 100 is characterized by a compact space saving architecture that may be particularly well suited to meet increasingly fine dimensional and lower power consumption constraints as fabrication technologies transition to the 40 nm node, for example, and beyond.

As discussed above, the use of passive mixers, such as high-band and low-band passive mixers 160a and 160b, to provide up-conversion in compact low-power transmitter 100 can be advantageous due to their significantly reduced power and area requirements when compared with conventional active mixer designs, such as Gilbert cells, for example. Moreover, and as previously described, high-band and low-band passive mixers 160a and 160b can be expected to provide excellent image rejection and very low local oscillator feedthrough across most gain ranges, while also representing persistent design solutions likely to scale with further advances in fabrication technology.

However, when compared to active mixers such as Gilbert cells, passive mixers 160a and 160b typically require a considerably larger driving current, as well as requiring that the previous stage, e.g., respective high performance buffers 120a and 120b, provide a low output impedance. In addition, those driving current and low previous stage output impedance requirements must be met without significantly impacting the performance of transmitter 100, or substantially contributing to its noise budget. For example, the performance constraints imposed upon high performance buffers 120a and 120b may include producing less than or equal to approximately twenty-five ohms (25Ω) of output impedance, providing up to approximately 1.0 mA of driving current, providing approximately 60 dB or better linearity, while concurrently producing less than or equal to approximately 0.8 nanovolts per root hertz (0.8 nV/√Hz) of noise at, for instance, 20 MHz and 45 MHz.

Figure 2:
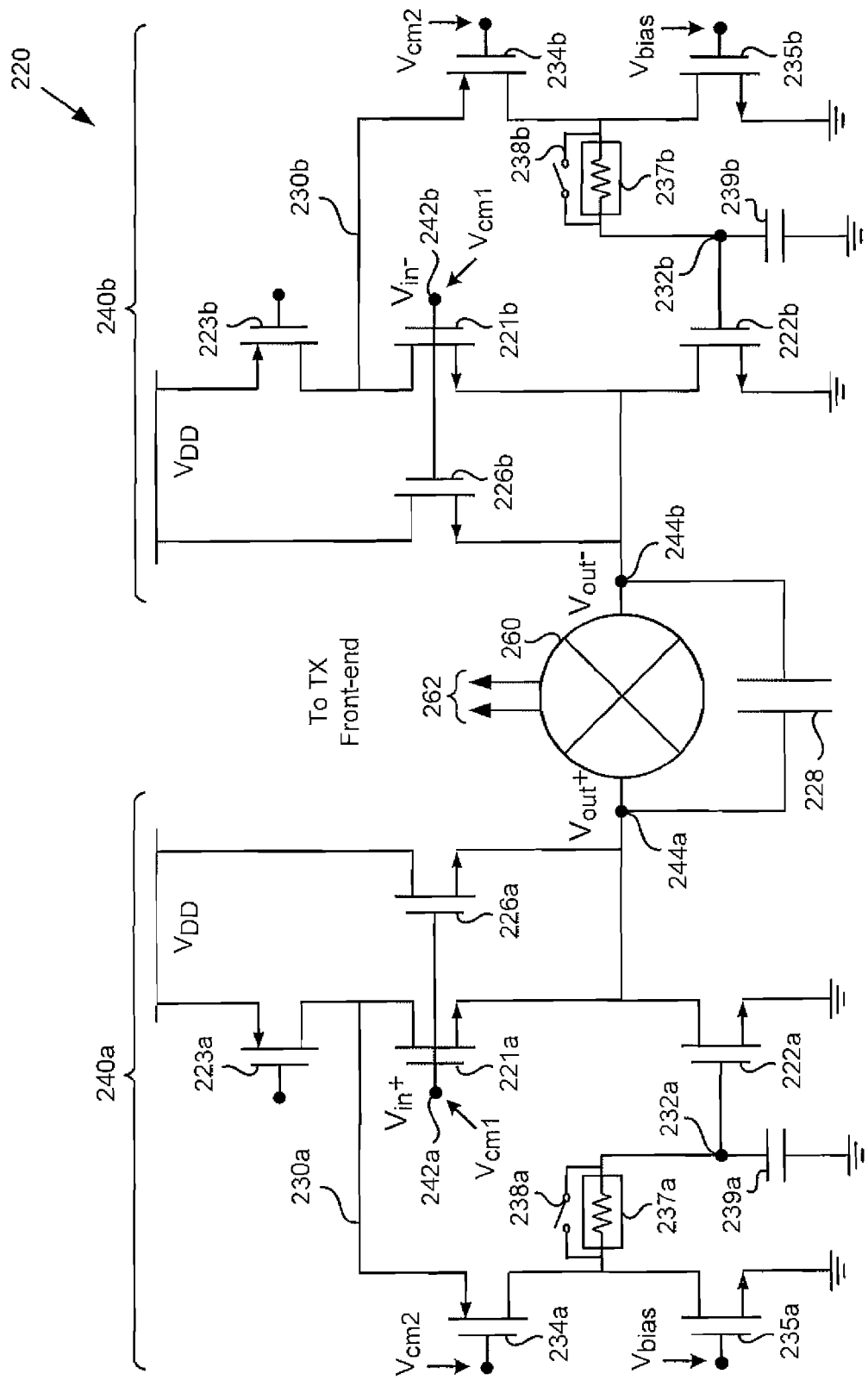
FIG. 2 is a diagram of a high performance buffer suitable for use as a pre-mixer buffer in the wireless transmitter of FIG. 1, according to one embodiment of the present invention.
Figure 3:
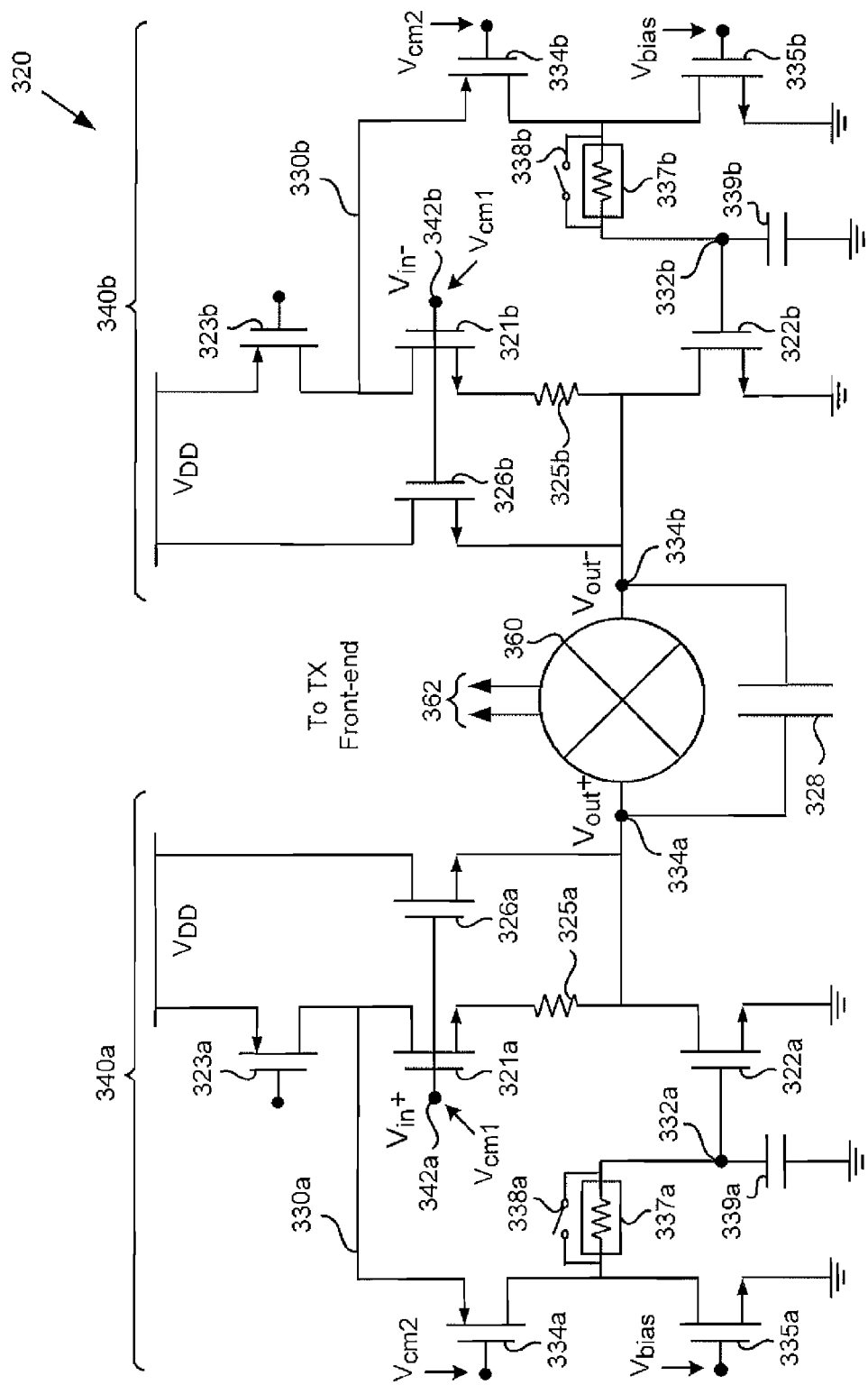
FIG. 3 is a diagram of a high performance buffer suitable for use as a pre-mixer buffer in the wireless transmitter of FIG. 1, according to another embodiment of the present invention.
Figure 4:
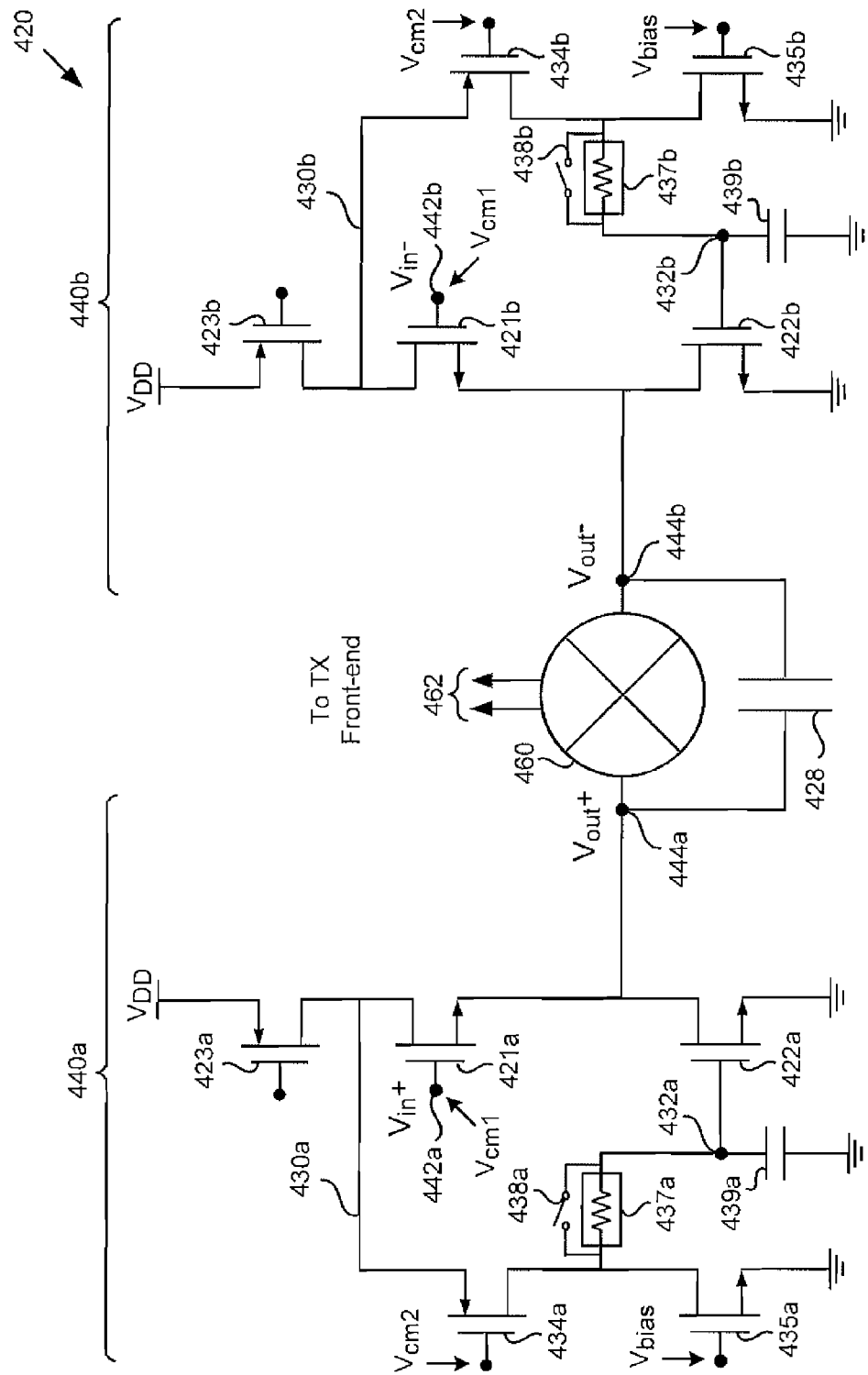
FIG. 4 is a diagram of a high performance buffer suitable for use as a pre-mixer buffer in the wireless transmitter of FIG. 1, according to yet another embodiment of the present invention.

Turning now to FIGS. 2, 3, and 4, those figures show respective examples of high performance buffers 220, 320, and 420, respectively, according to the present inventive principles, capable of overcoming the disadvantages associated with conventional designs and configured to meet or exceed the performance requirements described above. Referring first to FIG. 2, FIG. 2 shows a diagram of high performance buffer 220 suitable for use as a pre-mixer buffer in transmitter 100 of FIG. 1, according to one embodiment of the present invention, and can be seen to correspond to either or both of high performance buffers 120a and 120b, in FIG. 1.

High performance buffer 220, in FIG. 2, includes differential blocks 240a and 240b configured to receive differential input voltages Vin+ and Vin− at respective inputs 242a and 242b, and to provide differential output voltages Vout+ and Vout− at respective output nodes 244a and 244b, which are coupled by output capacitor 228 in the embodiment of FIG. 2. According to that embodiment, high performance buffer 220 is implemented as a pre driver buffer for mixer 260, which may correspond to either or both of high-band and low-band mixers 160a and 160b, in FIG. 1, and like those mixers, is implemented as a passive circuit in FIG. 2. Passive mixer 260 may be seen to represent an approximately five hundred ohm (500Ω) differential load, for example. Moreover, passive mixer 260 is shown in FIG. 2 as providing up-converted differential outputs 262 to the transmitter front-end, which may be seen to correspond to up-converted mixer outputs 162a and 162b provided by respective high-band and low-band passive mixers 160a and 160b to respective high-band and low-band variable gain control preamplification chains 170a and 170b, in FIG. 1.

As shown in FIG. 2, differential block 240a comprises driving transistors 221a and 226a for generating the driving current required for driving passive mixer 260. As further shown in FIG. 2, differential block 240a also comprises feedback path 230a including feedback transistor 234a, programmable feedback resistor 237a, switch 238a, and feedback capacitor 239a coupled between high impedance node 232a and ground. Also included in differential block 240a are current source transistor 223a and feedback biasing transistor 235a, as well as transistor 222a configured to adjust the operation of driving transistors 221a and 226a according to a feedback control voltage produced at high impedance node 232a.

Differential block 240b may be seen to mirror differential block 240a. Thus, differential block 240b comprises current source transistor 223b, driving transistors 221b and 226b, feedback biasing transistor 235b, transistor 222b, and feedback path 230b including feedback transistor 234b, programmable feedback resistor 237b, switch 238b, and feedback capacitor 239b coupled between high-impedance node 232b and ground. Analogously to the features included in differential block 240a, transistor 222b in differential block 240b is configured to adjust the operation of driving transistors 221b and 226b according to a feedback control voltage produced at high impedance node 232b. Moreover, the corresponding devices in differential blocks 240a and 240b are selected so as to be substantially matching devices. That is to say corresponding driving transistors 221a and 221b are selected to be substantially matching transistors, as are corresponding driving transistors 226a and 226b, feedback transistors 234a and 234b, programmable feedback resistors 237a and 237b, and so forth.

It is noted that each of the transistors shown in FIG. 2 is represented as one of an n-channel field-effect transistor (NFET) or a p-channel FET (PFET), such as a metal-insulator-semiconductor FET (MISFET) or metal-oxide-semiconductor FET (MOSFET). That representation is merely exemplary, however, and it is contemplated that in other embodiments, high performance buffer 220 may be implemented using other suitable types of switching devices. It is further noted that according to at least one exemplary embodiment, driving transistors 221a and 221b are implemented as native transistors (i.e. very low threshold voltage transistors), and may be further configured as native transistors fabricated so as to include a thick gate insulation layer, such as a thick gate oxide.

In the interests of economy and conceptual clarity, the operation of high performance buffer 220 will be discussed in terms of the features associated with differential block 240a. However, it is to be understood that because differential blocks 240a and 240b are complementary blocks implemented using substantially matching devices, the following discussion will be understood to describe the analogous operation of differential block 240b as well.

As a preliminary matter, it is noted that the implementation shown in FIG. 2 is a relatively simple solution using relatively few transistors. Moreover, and merely by way of conceptual perspective, differential blocks 240a and 240b can be thought of as implementing a source follower in combination with a secondary feedback system absent from conventional designs. For example, differential block 240a may be seen as a source follower in driving transistor 226a and transistor 222a, in combination with a secondary feedback system including driving transistor 221a, current source transistor 223a, feedback path 230a, and feedback biasing transistor 235a.

One advantage of the buffer architecture shown in FIG. 2, is that the gain of high performance buffer 220 can be selectively adjusted to substantially optimize performance, for example through use of programmable feedback resistor 237a and/or the selective opening and closing of switch 238a. In addition, feedback capacitor 239a provides an adaptive impedance due to its frequency response that can be further utilized to adjust the gain of high performance buffer 220. Another advantage is that, due to the architecture shown in FIG. 2, feedback capacitor 239a can be implemented using a MOSCAP, which introduce a significant savings in circuit area when compared with compensation capacitors implemented in conventional designs. Moreover, because of the area savings achievable through use of a MOSCAP for feedback capacitor 239a that capacitor may be larger than required simply for compensation purposes, and may thus be advantageously selected to reduce the gain of high performance buffer 220 at high frequencies.

Continuing to focus on differential block 240a of high performance buffer 220, current source transistor 223a, as its name implies, is implemented as a current source coupled to the drain of driving transistor 221a. The input voltage Vin+ to differential block 240a is received at input 242a corresponding to the gate of driving transistor 221a, which is also tied to the gate of driving transistor 226a. In addition, because the voltage Vout+ at output node 244a is substantially equal to the source voltage of driving transistors 221a and 226a, the difference between Vin+ and Vout+ effectively determines the current through each of driving transistor 221a and 226a. As a result, the mismatch in the respective currents in current source transistor 223a and driving transistor 221a is passed as a current fluctuation through feedback transistor 234a and programmable feedback resistor 237a or switch 238a, along feedback path 230a, and is converted to a control voltage for transistor 222a. The operation of transistor 222a in response to the feedback control voltage produced at high impedance node 232a affects Vout+, thereby adjusting the driving currents in driving transistors 221a and 226a.

According to the present embodiment, in addition to receiving input Vin+, the gate of driving transistor 221a is biased using Vcm1, which is a common mode bias voltage depending at least in part on the threshold voltage of driving transistor 221a. Moreover, in one embodiment, Vcm1 may be adjusted so as to substantially match the threshold voltage of driving transistor 221a. Moreover, FIG. 2 shows that feedback transistor 234a is biased using Vcm2, which may be a common mode bias voltage depending at least in part on the threshold voltage of feedback transistor 234a. Analogously to the case for Vcm1, in one embodiment, Vcm2 may be adjusted to substantially match the threshold voltage of feedback transistor 234a, for example, a biasing circuit including a diode connected transistor substantially matching feedback transistor 234a can be used to track the threshold voltage of feedback transistor 234a and provide substantially that voltage as Vcm2 at the gate of feedback transistor 234a.

Several significant advantages arise from the circuit architecture shown in FIG. 2. For example, as mentioned above, transistor 223a acts as a current source. However, there are practical limitations on how ideal a current source can be. One of the advantages of the circuit architecture represented by differential block 240a is that the swing of the signal at the drain of current source transistor 223a is small due to its inverse proportionality to the gain of transistor 222a. Because the drain voltage of current source transistor 223a is not changing significantly, transistor 223a is able to operate as a nearly ideal current source. In other words, the architecture of high performance buffer 220 produces a good current source at transistor 223a without the need for a cascode current source or a large supply. In addition, because of the feedback correction provided by feedback path 230a and the operation of transistor 222a, the current and transconductance of driving transistors 221a and 226a can be expected to remain substantially constant, thereby assuring that the output impedance of high performance buffer 220 remains low.

Another significant advantage of the circuit architecture of high performance buffer 220 is the efficiency of its layout. As discussed above, in order to drive passive mixer 260, high performance buffer 220 may be required to produce a driving current of up to approximately 1 mA. That driving current is provided partly by transistor 222a and partly by driving transistor 226a. However, a significant portion of that driving current is provided by driving transistor 221a, so that the same current that is being used in part to drive passive mixer 260 is also being used to lower the noise of driving transistor 221a and to provide the gain of high performance buffer 220. In other words, the architecture shown in FIG. 2 results in an effective overlap of the output stage and the input stage of high performance buffer 220, thereby increasing its design efficiency.

Thus, high performance buffer 220 is configured to achieve a high linearity, low output impedance, and low noise. However, another important performance constraint for high performance buffer 200 is the requirement that out of band noise be sharply limited. However, as discussed above, an additional advantage of the buffer architecture shown in FIG. 2 is that the loop gain of high performance buffer 220 can be selectively adjusted to substantially optimize performance, for example by determining the loop bandwidth of high performance buffer 220 and attenuating the gain outside that band. More specifically, in an example multi-mode implementation in which high performance buffer 220 is implemented to support both 3G communication modes and 2G communication modes in a wireless transmitter, programmable feedback resistor 237a, switch 238a, and feedback capacitor 239a can be utilized to selectively control the gain.

For instance, the loop bandwidth of high performance buffer 220 might be selected according to the bandwidth of the communication mode in use. According to that embodiment, the loop gain in 3G modes may be selectively controlled through the appropriate selection of feedback capacitor 239a alone to act as an effective AC short at higher frequencies, in which case switch 238a may be open to short programmable capacitor 237a during 3G mode operation. For example, feedback capacitor 239a may be have a capacitance of several picofarads (pF), or approximately 40 pF.

For lower bandwidth 2G communication modes, however, the effective impedance of feedback capacitor 239a alone may be insufficient to reduce out of band noise. In those lower bandwidth modes, switch 238a can be opened, and the loop gain of high performance buffer 220 can be controlled according to the resistance of programmable feedback resistor 237a. It is noted that an additional advantage flowing from the embodiment shown in FIG. 2 is that programmable feedback resistor 237a, switch 238a, and feedback capacitor 239a in the form of a compact MOSCAP, for example, enable use of a substantially smaller output capacitor 228 than is possible in conventional designs.

It is further noted that for embodiments of high performance buffer 220 designed to support additional larger bandwidth communication modes, such as LTE for example, suitable adjustments may be made to the size of feedback capacitor 239a and/or the range of resistances producible using programmable feedback resistor 237a to accommodate the required loop bandwidth gain control. Moreover, it is noted that in other embodiments, the loop bandwidth of high performance buffer 220 may be controlled using a tunable capacitor rather than a fixed capacitor as feedback capacitor 239a.

Moving now to FIG. 3, FIG. 3 shows a diagram of high performance buffer 320 suitable for use as a pre-mixer buffer in transmitter 100 of FIG. 1, according to another embodiment of the present invention. High performance buffer 320, in FIG. 3, includes differential blocks 340a and 340b configured to receive differential input voltages Vin+ and Vin− at respective inputs 342a and 342b, and to provide differential output voltages Vout+ and Vout− at respective output nodes 344a and 344b.

According to the embodiment shown in FIG. 3, high performance buffer 320 also includes output capacitor 328, and is implemented as a pre driver buffer for passive mixer 360. High performance buffer 320 including output capacitor 328 and differential blocks 340a and 340b, and passive mixer 360 correspond respectively to high performance buffer 220 including output capacitor 228 and differential blocks 240a and 240b, and passive mixer 260, in FIG. 2. Moreover, the features comprised by differential blocks 340a and 340b and bearing reference numerals corresponding to features shown and described in relation to FIG. 2 correspond respectively to those previously described features. Thus, driving transistors 321a and 326a correspond respectively to driving transistors 221a and 226b, feedback transistor 334a corresponds to feedback transistor 234a, and so forth.

In addition to the features discussed above, high performance buffer 320 further comprises resistors 325a and 325b coupled to the sources of respective driving transistors 321a and 321b. Resistors 325a and 325b may be quite small, and may comprise approximately 20Ω to 30Ω fixed resistors, for example. Resistors 325a and 325b, in combination with output capacitor 328, serve to further reduce the out of band noise of high performance buffer 320. Although the presence of resistors 325a and 325b would appear to undesirably increase the output impedance of high performance buffer 320, their effective impedance is reduced by the loop gain of high performance buffer 320 for frequencies included in the loop bandwidth. As a result, resistors 325a and 325b can advantageously further improve the out of band noise performance of high performance buffer 320 while having only minimal impact on output impedance for in band frequencies.

Turning to FIG. 4, FIG. 4 shows a diagram of high performance buffer 420 suitable for use as a pre-mixer buffer in transmitter 100 of FIG. 1, according to yet another embodiment of the present invention. High performance buffer 420, in FIG. 4, includes differential blocks 440a and 440b configured to receive differential input voltages Vin+ and Vin– at respective inputs 442a and 442b, and to provide differential output voltages Vout+ and Vout– at respective output nodes 444a and 444b.

According to the embodiment shown in FIG. 4, high performance buffer 420 also includes output capacitor 428, and is implemented as a pre driver buffer for passive mixer 460. High performance buffer 420 including output capacitor 428 and differential blocks 440a and 440b, and passive mixer 460 correspond respectively to high performance buffer 220 including output capacitor 228 and differential blocks 240a and 240b, and passive mixer 260, in FIG. 2. Moreover, the features comprised by differential blocks 440a and 440b and bearing reference numerals corresponding to features shown and described in relation to FIG. 2 correspond respectively to those previously described features. Thus, driving transistor 421a corresponds to driving transistor 221a, feedback transistor 434a corresponds to feedback transistor 234a, and so forth.

In contrast to the circuit architecture shown in FIG. 2, high performance buffer 420, in FIG. 4, omits driving transistors corresponding to driving transistors 226a and 226b, resulting in a still simpler design using fewer transistors. The example implementation shown in FIG. 4 is exemplary of the many variations in circuit architecture capable of embodying the present inventive principles, and configured to provide the numerous advantages in performance and efficiency described above. For example, the embodiment shown by high performance buffer 420 may be further modified through the addition of resistors corresponding to resistors 325a and 325b, in FIG. 3.

Thus, the present application discloses embodiments of a high performance buffer suitable for implementation as a pre-mixer buffer in a communications system, for example, in an RF transmitter used as part of a wireless communication device transceiver. As disclosed herein, the present novel and inventive principles can be utilized to implement various embodiments of a high performance buffer configured to achieve high linearity, low output impedance, and low noise, while concurrently providing a compact, low-power design solution capable of scaling with further advances in semiconductor fabrication technology.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A buffer for use in a communications system, said buffer comprising:
    first and second differential blocks;
    each of said first and second differential blocks including at least one driving transistor for generating a driving current for a load, a gate of said at least one driving transistor receiving a first common mode bias voltage depending at least in part on a threshold voltage of said at least one driving transistor;
    a first feedback path configured to adjust an operation of said at least one driving transistor of said first differential block and including a first feedback transistor that receives a second common mode bias voltage of said first feedback path depending at least in part on a threshold voltage of said first feedback transistor; and
    a second feedback path configured to adjust an operation of said at least one driving transistor of said second differential block and including a second feedback transistor that receives a second common mode bias voltage of said second feedback path depending at least in part on a threshold voltage of said second feedback transistor, wherein
    the first feedback path is separate from the second feedback path, and
    the first feedback path includes a voltage divider that provides a divided voltage to a capacitor, and the divided voltage stored on the capacitor controls a control transistor that adjusts the operation of the at least one driving transistor of the first differential block.

2. The buffer of claim 1, wherein said load is a mixer in a transmitter module of said communications system.

3. The buffer of claim 2, wherein said mixer is a passive mixer.

4. The buffer of claim 1, wherein each of said first and second feedback paths further comprises a programmable feedback resistor and a feedback capacitor driven respectively by said first and second feedback transistors.

5. The buffer of claim 4, wherein said feedback capacitor comprises a metal-oxide-semiconductor capacitor (MOSCAP) coupled between a high impedance node and ground.

6. The buffer of claim 1, wherein said first and second feedback paths are configured to selectably suppress a loop gain of said buffer.

7. The buffer of claim 1, wherein said at least one driving transistor comprises a native transistor.

8. The buffer of claim 1, wherein said second common mode bias voltage of each of said first and second feedback paths is adjusted to substantially match said threshold voltage of said first and second feedback transistors respectively.

9. The buffer of claim 1, wherein said buffer is configured to produce less than or equal to approximately 25Ω of output impedance, provide up to approximately 1.0 mA of driving current, provide approximately 60 dB or better linearity, and produce less than or equal to approximately 0.8 nV/√Hz of noise at 20 MHz and 45 MHz.

10. A buffer for use in driving a mixer in a communications system, said buffer comprising:
    first and second differential blocks;
    each of said first and second differential blocks including at least two driving transistors configured to generate a driving current for said mixer, a gate of at least one of said at least two driving transistor receiving a first common mode bias voltage depending at least in part on a threshold voltage of said at least one of said at least two driving transistors;
    a first feedback path that adjusts an operation of said at least two driving transistors of said first differential block and including a first feedback transistor that receives a second common mode bias voltage of said first feedback path depending at least in part on a threshold voltage of said first feedback transistor; and
    a second feedback path that adjusts an operation of said at least two driving transistors of said second differential block and including a second feedback transistor that receives a second common mode bias voltage of said second feedback path depending at least in part on a threshold voltage of said second feedback transistor, wherein the first feedback path is separate from the second feedback path, and the first feedback path includes a voltage divider that provides a divided voltage to a capacitor, and the divided voltage stored on the capacitor controls a control transistor that adjusts the operation of the at least two driving transistors of the first differential block.

11. The buffer of claim 10, wherein said mixer is implemented in a transmitter module of said communications system.

12. The buffer of claim 10, wherein said mixer is a passive mixer.

13. The buffer of claim 10, wherein each of said first and second feedback paths further comprises a programmable feedback resistor and a feedback capacitor driven respectively by said first and second feedback transistors.

14. The buffer of claim 13, wherein said feedback capacitor comprises a metal-oxide-semiconductor capacitor (MOSCAP) coupled between a high impedance node and ground.

15. The buffer of claim 10, wherein said first and second feedback paths are configured to selectably suppress a loop gain of said buffer.

16. The buffer of claim 10, wherein at least one of said at least two driving transistors comprises a native transistor.

17. The buffer of claim 10, wherein said second common mode bias voltage of each of said first and second feedback paths is adjusted to substantially match said threshold voltage of said first and second feedback transistors respectively.

18. The buffer of claim 10, wherein said buffer is configured to produce less than or equal to approximately 25Ω of output impedance, provide up to approximately 1.0 mA of driving current, provide approximately 60 dB or better linearity, and produce less than or equal to approximately 0.8 nV/√Hz of noise at 20 MHz and 45 MHz.

* * * * *